United States Patent [19]
Kelly et al.

[11] Patent Number: 5,336,943
[45] Date of Patent: Aug. 9, 1994

[54] TEMPERATURE SENSING CIRCUIT

[75] Inventors: Brendan P. Kelly; Royce Lowis, both of Stockport, England

[73] Assignee: U.S. Philips Corporation, New York, N.Y.

[21] Appl. No.: 907,477

[22] Filed: Jul. 1, 1992

[30] Foreign Application Priority Data

Jul. 19, 1991 [GB] United Kingdom ............... 9115677
Nov. 8, 1991 [GB] United Kingdom ............... 9123784

[51] Int. Cl.⁵ ..................... G06G 7/10; H03K 5/22
[52] U.S. Cl. .................... 307/310; 307/350; 307/355; 307/356; 307/358; 307/491
[58] Field of Search ............. 307/350, 355–356, 307/358, 310, 491

[56] References Cited
U.S. PATENT DOCUMENTS
4,201,947 5/1980 Schado, Jr. ................. 307/362

FOREIGN PATENT DOCUMENTS
2096771 10/1982 United Kingdom.

OTHER PUBLICATIONS
"Integrated MOS temperature sensor" by R. C. Jaeger and D. V. Kerns published in the Conference Proceedings of the 1980 IEEE Region 3 Conference and Exhibit Apr. 13, 14, 15, 16, 1980 Nashville Tenn.

Primary Examiner—Margaret Rose Wambach
Attorney, Agent, or Firm—Bernard Franzblau

[57] ABSTRACT

A temperature sensing circuit has a first insulated gate field effect device which is operated deep into its sub-threshold region where the voltage across the device varies with temperature and has a second insulated gate field effect device which is operated in an area of its square law region where the voltage across the second insulated gate field effect device is substantially independent of temperature. A comparator compares the voltages across the first and second field effect devices and provides a signal OT indicating the temperature sensed by the first insulated gate field effect device.

25 Claims, 3 Drawing Sheets

TEMPERATURE SENSING CIRCUIT

BACKGROUND OF THE INVENTION

This invention relates to a temperature sensing circuit using insulated gate field effect devices for sensing temperature.

In particular, this invention relates to a temperature sensing circuit comprising a first insulated gate field effect device, a second insulated gate field effect device, means for operating the first insulated gate field effect device in its subthreshold region so that the voltage across the first insulated gate field effect device varies with temperature, and means for comparing the voltages across the first and second insulated gate field effect devices.

Such temperature sensing circuits are described in, for example, GB-A-2096771 and a paper entitled "Integrated MOS temperature sensor" by R. C. Jaeger and D. V. Kerns published in the Conference Proceedings of the 1980 IEEE Region 3 Conference and Exhibit Apr. 13, 14, 15, 16, 1980 Nashville, Tenn.

In each of these prior documents, the first and second insulated gate field effect devices are each formed by an insulated gate field effect transistor (IGFET). The two IGFETs are arranged to be operated in their subthreshold region where the drain current Id varies logarithmically with the gate-to-source voltage Vgs in a manner such that the slope of the Id versus Vgs curve is constant over many decades and directly proportional to temperature. The two IGFETs are arranged to have different drain currents by, for example, appropriately scaling the channel width and length geometry of the IGFETs and/or by appropriately scaling load resistors connected in series with the IGFETs. The difference in the gate-source voltage ΔVgs of the two IGFETs may thus be used as a measure of absolute temperature.

SUMMARY OF THE INVENTION

According to the present invention, there is provided a temperature sensing circuit comprising a first insulated gate field effect device, a second insulated gate field effect device, means for operating the first insulated gate field effect device in its subthreshold region so that the voltage across the first insulated gate field effect device varies with temperature, and means for comparing the voltages across the first and second insulated gate field effect devices, characterised in that means are provided for operating the second insulated gate field effect device in an area of its square law region where the voltage across the second insulated gate field effect device is substantially independent of temperature and in that the comparing means provides a signal indicative of the temperature sensed by the first insulated gate field effect device.

Thus, in a circuit in accordance with the invention, the second insulated gate field effect device is operated in an area of its operating range in which the voltage across the device is substantially independent of temperature. Accordingly, a substantially temperature-invariant voltage provided across the second insulated gate field effect device is compared with the temperature dependent voltage across the first insulated gate field effect device which is operated in its subthreshold region. Such a circuit should be more sensitive to changes in temperature than a circuit where, as in the prior art discussed above, the first and second insulated gate field effect devices are operated in the subthreshold range so that the voltage across both devices varies with temperature and the difference signal is dependent on the different drain currents produced by the different geometry or load resistors.

In one preferred example, a resistor may be provided in series with the first insulated gate field effect device and the comparing means is arranged to compare the voltage across the series connection of the first insulated gate field device and the resistor with the voltage across the second insulated gate field effect device. This enables the circuit to be less sensitive to changes in the circuit supply voltage.

Preferably, the first and second insulated gate field effect devices comprise diode-connected insulated gate field effect transistors (IGFETs) so that the voltage across the devices, that is the drain source voltage, is equal to the gate-source voltage. This should provide a more accurate circuit than could be achieved if there were a fixed relationship in voltage between the gate and drain of each IGFET.

The first insulated gate field effect device may comprise at least two series-connected IGFETs while the second insulated gate field effect device may comprise a single IGFET. This enables a common process to be used to produce the IGFETs so that the at least three IGFETs are all produced at the same time and have similar dopant concentrations and gate oxide thicknesses, and thus similar threshold voltages, while allowing the IGFETs forming the first insulated gate field effect device to be operated in their subthreshold regions.

In a preferred example, the first insulated gate field effect device may comprise two insulated gate field effect transistors each having one main electrode connected to its gate electrode, the other main electrode of one of the two transistors being connected to the one main electrode of the other transistor, each of the two transistors having a back gate electrode with the back gate electrode of the other transistor connected to the same potential as the back gate electrode of the one transistor. The back gate bias on the other transistor acts to raise its threshold voltage so as to enable only two IGFETs to be used to form the first insulated gate field effect device while ensuring that the two IGFETs of the first insulated gate field effect device are operated deep in their subthreshold regions. If the back gate of the other IGFET is simply connected to its source in the usual manner, then three (or possibly four) series-connected IGFETs may be required to ensure that the first insulated gate field effect device operates deep in the subthreshold region.

At least part of the means for operating the insulated gate field effect device in the appropriate regions may comprise respective resistors connected in series with the first and second insulated gate field effect device for determining a respective bias current for the associated insulated gate field effect device. The load resistors may act in conjunction with characteristics of the insulated gate field effect device themselves. Thus, for example, the first and second insulated gate field effect devices may have different conduction channel widths and so different current densities.

Each resistor may comprise a diffused resistor formed adjacent a surface region of the one conductivity type of a semiconductor body with each resistor comprising a first region of the opposite conductivity type formed within the surface region and a second region of the one conductivity type formed within the first region, first and second electrodes being provided spaced-apart in contact with the second region which provides a resistive path between the first and second electrodes, and a third electrode being provided for connecting the second region to a fixed reference potential.

It has been found that such resistors have a temperature coefficient of resistance which is substantially constant over a wide temperature range in contrast to conventional diffused resistors which have a temperature coefficient which decreases with temperature. Such a variation in resistance with temperature may be more easily compensated for, for example, by the change in threshold voltage of the insulated gate field effect device with temperature.

Voltage clamping means may be provided for regulating the voltage across the first and second insulated gate field effect devices. The voltage clamping means may comprise a series arrangement of diode-connected insulated gate field effect transistors. Such diode-connected IGFETs may be formed with the first and second insulated gate field effect devices and thus be subject to the same process variations. Accordingly, any variations in dopant concentration, etc. which may lead to changes in, for example, threshold voltage will be automatically mirrored or tracked in the voltage clamping means.

The circuit may be integrated with a power semiconductor device so that the circuit provides a signal for switching off the power semiconductor device when the temperature sensed by the first insulated gate field effect device exceeds a predetermined value.

A circuit in accordance with the present invention may have particular advantages where the power semiconductor device forms a low-side switch, that is where the power semiconductor device is connected in series between a load and the negative supply line, generally earth (ground). Thus, for example, the present circuit can be formulated without complementary MOSFETs or bipolar transistors which would in such circumstances require complex technology and many mask levels. In addition, the circuit is relatively insensitive to substrate bias and/or fluctuations in the substrate voltage which may arise where the substrate provides, for example, the drain connection of a power MOSFET (or IGBT) and the drain electrode is connected to a load such as a lamp.

BRIEF DESCRIPTION OF THE DRAWING

Embodiments of the invention will now be described, by way of example, with reference to the accompanying drawings, in which.

DESCRIPTION OF THE PREFERRED EMBODIMENTS

Figure 2:
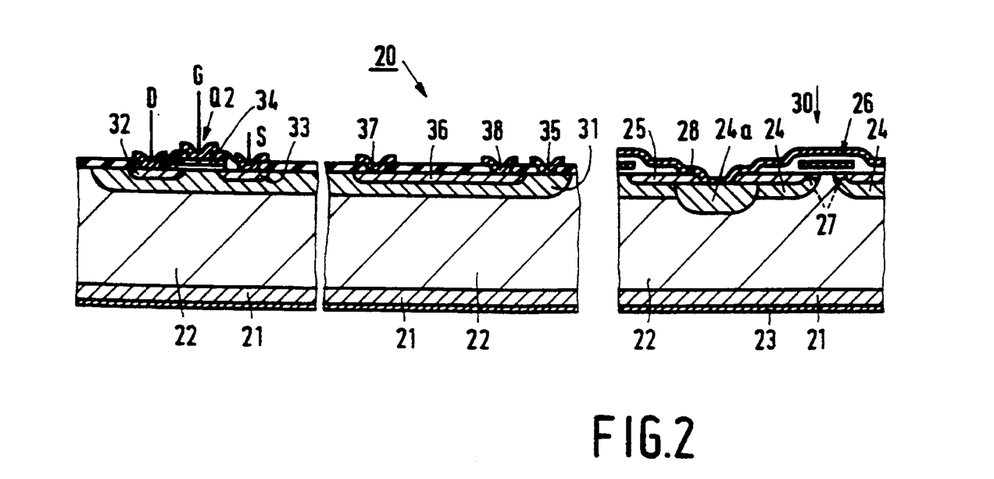
FIG. 2 illustrates, by way of a schematic cross-sectional view through a part of a semiconductor body, the structure of examples of an insulated gate field effect transistor and a resistor used in one example of a circuit in accordance with the invention.

It should be understood that FIG. 2 in particular is merely schematic and is not drawn to scale. Thus, certain dimensions such as the thickness of layers or regions may have been exaggerated while other dimensions may have been reduced. It should also be understood that the same reference numerals are used throughout the Figures to indicate the same or similar parts.

Figure 1:
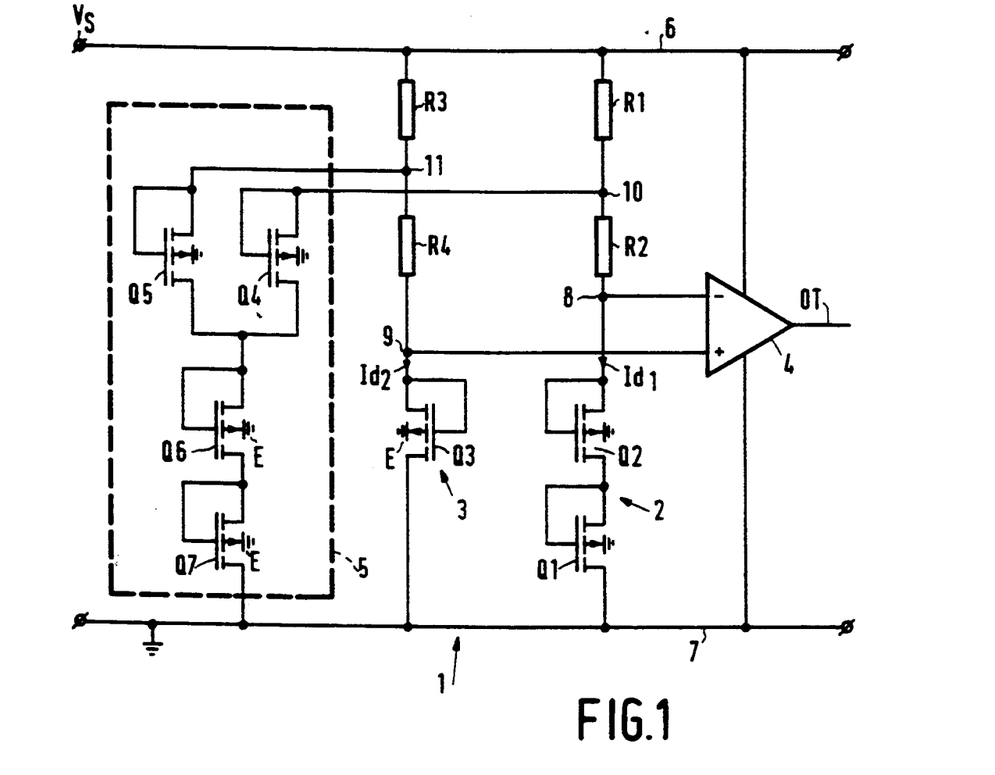
FIG. 1 illustrates a circuit diagram for a temperature sensing circuit in accordance with the invention.
Figure 5:
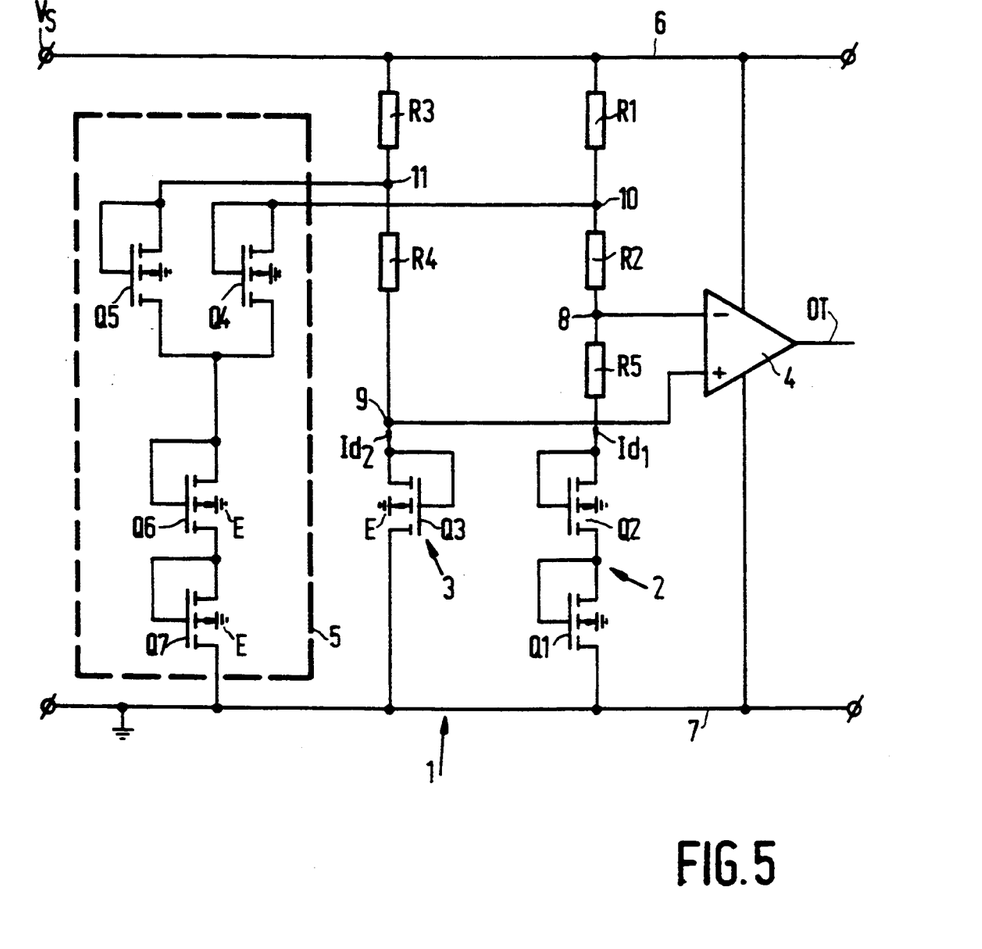
FIG. 5 illustrates the circuit diagram for a modified temperature sensing circuit in accordance with the invention.

Referring now the drawings, especially FIGS. 1 or 5, a temperature sensing circuit 1 comprises a first insulated gate field effect device 2, a second insulated gate field effect device 3, means R1, R2, 5 for operating the first insulated gate field effect device 2 in its subthreshold region so that the voltage across the first insulated gate field effect device 2 varies with temperature, and means 4 for comparing the voltages across the first and second insulated gate field effect devices 2 and 3. In accordance with the invention, means R3, R4, 5 are provided for operating the second insulated gate field effect device 3 in an area of its square law region where the voltage across the second insulated gate field effect device 3 is substantially independent of temperature and the comparing means 4 provides a signal OT indicating the temperature sensed by the first insulated gate field effect device.

Such a circuit should be more sensitive to temperature than a circuit which relies on the change with temperature of the difference in gate-source voltages of two insulated gate field effect transistors both operated in their subthreshold region, but with different drain currents.

FIG. 1 illustrates one example of a circuit 1 in accordance with the invention.

The circuit 1 shown in FIG. 1 has first and second power supply lines 6 and 7. The first power supply line 6 is generally connected to a positive supply voltage Vs while the second power supply line 7 is, in this example, connected to earth (ground).

The first insulated gate field effect device 2 is formed in this case by two n-channel insulated gate field effect transistors (IGFETs) Q1 and Q2. IGFET Q1 has its source connected to the second power supply line 7 and its gate and drain connected together and to the source of the IGFET Q2. The drain and gate of IGFET Q2 are similarly connected together. The drain of IGFET Q2 is connected at a node or junction 8 to two series-connected resistors R1 and R2 which, as will be explained below, serve to form at least a part of the means for operating the first insulated gate field effect device 2 in its subthreshold region. Resistor R1 is connected to the first power supply line 6. The node 8 is also connected to the negative input of a comparator 4. The comparator 4 may be of any suitable form, for example, any suitable form of differential amplifier. It is preferred, however, for ease of manufacture, that the comparator 4 be formed in a manner which does not require the use of IGFETs of a type complementary to IGFETs Q1 and Q2 (that is in this case, that the comparator 4 does not include p channel IGFETs) and that the use of bipolar transistors be avoided.

The second insulated gate field effect device 3 comprises in this case a single IGFET Q3 which, as mentioned above and as will be explained below, is operated at an area in its square law region where the voltage across the IGFET Q3 is substantially independent of temperature.

The IGFET Q3 has its source connected to the second power supply line 7 while its gate is connected to its drain and to a node 9. The node 9 is connected via series-connected third and fourth resistors R3 and R4 to the first power supply line 6. The node 9 is also connected to the positive input of the comparator 4.

As illustrated in FIG. 1, a voltage clamping circuit 5 may be provided to ensure that the first and second insulated gate field effect devices 2 and 3 operate in the desired regions, even if there should be changes, for example spikes, in the supply voltage Vs. The voltage clamping circuit 5 is connected to nodes 10 and 11 between the first and second resistors R1 and R2 and the third and fourth resistors R3 and R4, respectively, so as to limit the maximum voltage at these nodes 10 and 11. It will of course be appreciated that resistors R1 and R2 and resistors R3 and R4 could be replaced by respective single resistors of appropriate value in which case the voltage clamping circuit 5 would be connected between the first power supply line 6 and the resistors.

The voltage clamping circuit 5 could be of any suitable form, for example, one or more zener diodes. In this example however the voltage clamping circuit 5 is formed by a chain or series-connection of a number of gate-drain connected n-channel insulated gate field effect transistors which will be rendered conducting so as to connect the nodes 10 and 11 to the second supply line 7 if the desired maximum voltage, for example four volts, is exceeded. In the example, shown the drain of a gate-drain connected IGFET Q4 and Q5 is connected to node 10 and 11, respectively, and the sources of the IGFETs Q4 and Q5 are connected to two series-connected gate-drain connected IGFETs Q6 and Q7 with the source of IGFET Q7 being connected to the second supply line 7. Of course the number of IGFETs used will depend on their precise characteristics and the desired maximum voltage. The use of such a voltage clamping circuit 5 has advantages where the components of the circuit are integrated in a semiconductor body because the same diffusions may be used to form the IGFETs Q4 to Q7 as is used to form the IGFETs Q1 to Q3 so that any process variations which might affect the threshold voltages of Q1 to Q3 will similarly affect the IGFETs Q4 to Q7 so providing a compensating variation in the clamping voltage of the clamping circuit 5.

As indicated above, in accordance with the invention, the second IGFET Q3 is operated in an area of its square law region at which its drain current Id and thus the gate-source voltage across the IGFET Q3 is substantially independent of temperature while the IGFETs Q1 and Q2 are operated in their subthreshold regions where their drain current and thus the gate-source voltage across the IGFETs Q1 and Q3 varies with temperature.

Figure 3:
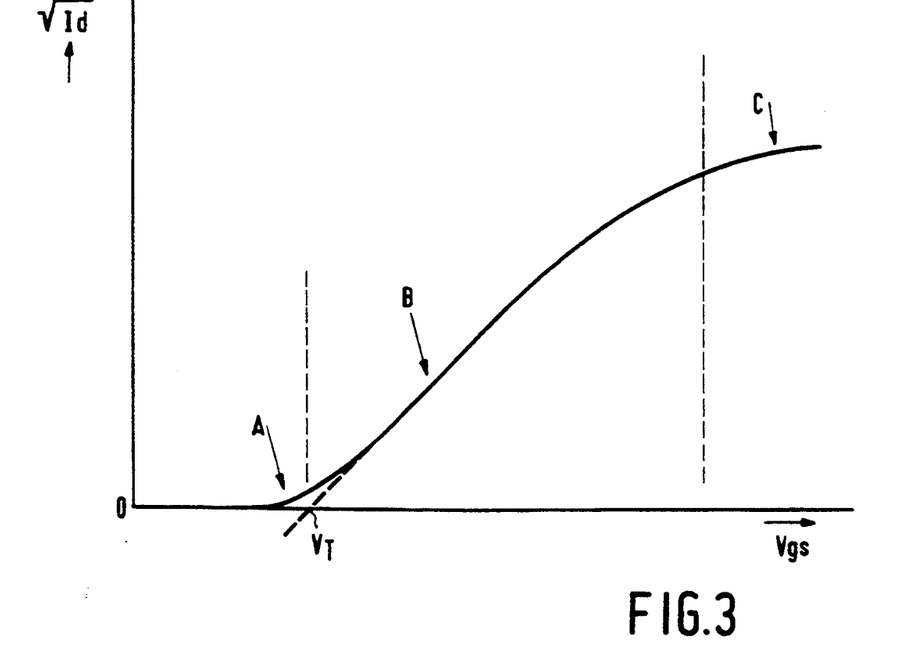
FIG. 3 illustrates graphically the relationship between the square root of the drain current Id and the gate-to-source voltage Vgs of an insulated gate field effect transistor.

FIG. 3 illustrates graphically the different regions of operation of an IGFET by plotting the square root of the drain current Id against the gate-source voltage Vgs.

In the subthreshold region (the weak inversion region) indicated by the reference sign A in FIG. 3 the gate voltage is below the threshold voltage $V_T$ and the drain current Id is exponentially proportional to the gate-source voltage. In the so-called square law region B the threshold voltage $V_T$ has been exceeded and the IGFET is in strong inversion with the drain current Id being proportional to the square of the gate voltage so that the relationship between $\sqrt{Id}$ and Vgs is linear. As the gate voltage increases even further the linear or saturation region C is reached in which the drain current Id varies linearly with the gate voltage until at a given voltage pinch-off occurs beyond which the drain current remains essentially the same.

In the present case we are concerned with the subthreshold region A and the square law region B.

In the subthreshold or weak inversion region A, the drain current is dominated by diffusion and as is explained in various text books (see for example The Physics of Semiconductor Devices Second Edition by S. M. Sze published by John Wiley & Sons Inc at pages 433 to 453 for a discussion of the basic characteristics of IGFETs (MOSFETs)) can be derived in a similar manner to the collector current of a bipolar transistor. The temperature dependence of the drain current Id in the weak inversion or subthreshold region A is dominated by the negative temperature coefficient of the threshold voltage so that as explained in Sze, for example, for a given gate-source voltage the subthreshold current Id will increase as the temperature increases. In the present case, the gate-drain connection of the IGFETs Q1 and Q2 constrains the drain current Id. Accordingly, if the temperature sensed by the IGFETs Q1 and Q2 rises the gate-source voltage of the IGFETs Q1 and Q2 will decrease to allow the IGFETS Q1 and Q2 to maintain the same drain current Id. Accordingly, the gate-source voltage Vgs of the IGFETs Q1 and Q2 will decrease as the temperature sensed or experienced by the IGFETs Q1 and Q2 increases.

In contrast the second insulated field effect device 3 formed by the IGFET Q3 has a temperature coefficient which is effectively zero, that is its gate-source voltage Vgs is substantially constant regardless of temperature. This is achieved by operating the IGFET Q3 in an area of its square law region B at which the temperature dependence of the drain current Id is negligible. This is the area D in FIG. 4 which plots drain current Id against gate source voltage Vgs for various different temperatures with temperature decreasing from the solid line Id-Vgs curve a through the dashed line curve b, the dot-dashed line curve c and finally the dotted line curve d. As can be seen from FIG. 4, below the drain current $Id_c$ at the area D, that is at the end of the square law region B adjacent the subthreshold region A, bipolar effects dominate and the drain current increases with temperature so that where the drain current Id is fixed the gate-source voltage Vgs will have to fall with temperature. This is, of course, the effect which dominates in the subthreshold region A. Above the area D, the temperature dependence of the drain current Id tends to be dominated by the mobility temperature dependence and accordingly, as shown, in this region the drain current Id will fall with increasing temperature so that where the drain current Id is fixed the gate-source voltage will increase with temperature. At the area D these two effects compensate for one another so that the drain current $Id_c$ and gate-source voltage $Vgs_c$ remain effectively constant with, in the example given in FIG. 4, the gate-source voltage $Vgs_c$ being about 1.5 volts at the area D.

Figure 4:
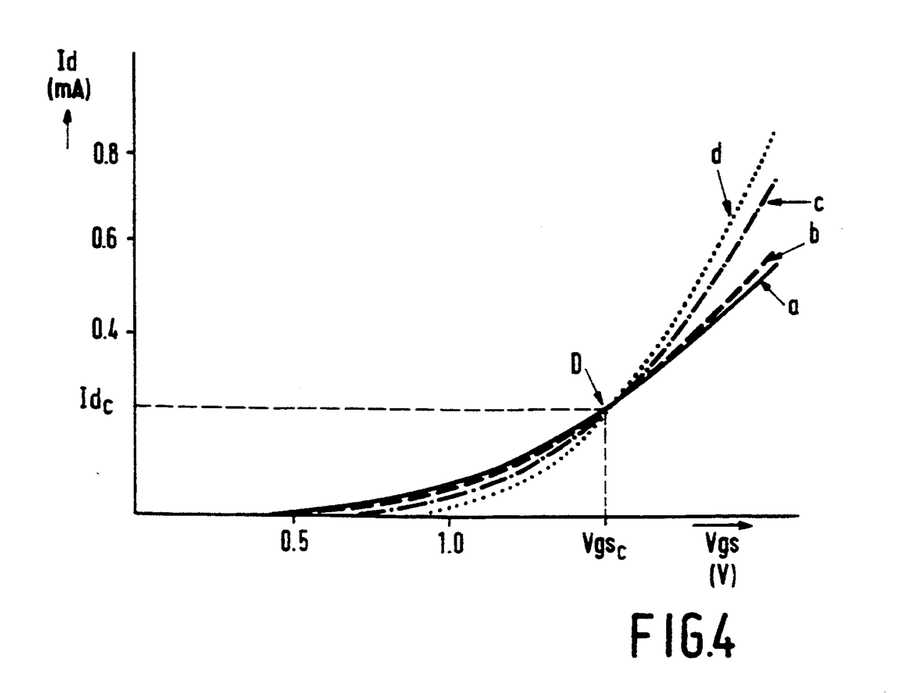
FIG. 4 illustrates graphically the manner in which the relationship between the drain current Id and the gate-to-source voltage Vgs of an insulated gate field effect transistor operated in its square law region changes with temperature.

As will be appreciated the drain current $Id_1$ of the IGFETs Q1 and Q2 must be kept low to ensure that they operate in their subthreshold region while the drain current $Id_2$ of the IGFET Q3 needs to be such as to maintain the IGFET Q3 at its zero temperature coefficient area D in its square law region. This can be achieved by a scaling of the resistors R1 and R2 and R3 and R4 so that R1 and R2 are bigger than R3 and R4 and by scaling the geometries of the IGFETs Q1 and Q2 with respect to that of the IGFET Q3 so that, for example, the channel widths of the IGFETs Q1 and Q2 are much larger (and the current densities thus much lower) than that of the IGFET Q3. In addition the use of two or more series-connected IGFETs to form the first temperature sensing device 2 assists in maintaining the first temperature sensing device 2 in the subthreshold region A while providing a difference signal for the comparator 4 which can be detected without amplification because the gate-source voltage across each IGFET Q1 or Q2 forms only a part of the voltage at the node 8. In the present case the back gates of the IGFETs Q1 to Q7 are all connected to the second supply line 7, that is earth (ground) in this case. In the interests of clarity this is indicated in FIG. 1 by the ground symbol E at the end of the back gate connection rather than by an actual connection line to the second power supply line 7. It will of course be appreciated that the back gates could be connected to their respective sources in the conventional manner. The connection of the back gates of the IGFETs to the second supply line 7 does, however, have an advantage especially insofar as the first insulated gate field effect device 2 is concerned. Thus, as will be appreciated from FIG. 1, although the back gate of IGFET Q1 is connected to the same potential as its source, the connection of the back gate of IGFET Q2 to the second supply line 7 means that the back gate is at a lower potential than its source. This forms in effect a substrate bias which, as is known to those skilled in the art, affects the threshold voltage and thus in this case the gate-source voltage of an IGFET. Thus, although the IGFETs Q1 and Q2 may in other respects be identical, the gate-source voltage of IGFET Q2 will be higher than that of IGFET Q1 at a given drain current Id. This increase in Vgs afforded by the substrate bias enables the use of two rather than three IGFETs to form the first insulated gate field effect device 2 where, for example, all three IGFETs Q1 to Q3 are identical apart from their different channel widths. To give some examples in order to maintain the first and second insulated gate field effect devices 2 and 3 in their subthreshold region and zero temperature efficient region, respectively, where the voltage between the first and second power supply lines 6 and 7 is typically 4–5 volts, then resistors R1 and R2 may have a nominal resistance at a reference temperature (27° C.) of 200 kilo-ohm and 20 kilo-ohm, respectively with the first and second IGFETs Q1 and Q2 each having a channel width W which is 100/15 times that of IGFET Q1 and a channel length L which is similar to that of IGFET Q1. For example IGFETs Q1 and Q2 may have a ration W/L of 100/15. IGFETs Q4 to Q7 may all have a similar channel length but IGFETs Q6 and Q7 may have a channel width half that of IGFETs Q4 and Q5. In this example IGFETs Q4 and Q5 may have a channel width to length ratio of 100/7.

It will of course be appreciated that the actual channel width to length rations of the various IGFETs Q1 to Q7 and the resistors R1 to R4 will depend on many things, for example, the particular process conditions used to produce the components, and the temperature operating and sensitivity ranges desired for the circuit 1.

The circuit 1 may be, for example, designed to provide a signal indicating when the temperature of a semiconductor device such as a power MOSFET or IGBT exceeds a given value to enable the power semiconductor device to be switched off to avoid or at least reduce the possibility of breakdown due to thermal effects. The circuit 1 could be provided in a separate semiconductor body placed on top of the power semiconductor device. However, it is preferred that the circuit 1 or at least the first insulated gate field effect device 2 which is to sense the temperature of the power semiconductor device be integrated into the same semiconductor body 1 as the power semiconductor device.

FIG. 2 is a cross-sectional view of a part of a semiconductor body 20 for illustrating the integration of the circuit 1 with a power semiconductor device. It will of course be appreciated that only part of the structure is shown in FIG. 2. The interconnections between the various components are not shown in FIG. 2.

In the example of FIG. 2, the semiconductor body 20 comprises a relatively highly doped n conductivity type monocrystalline silicon substrate 21 onto which is provided a relatively lowly doped n conductivity type epitaxial layer 22. In this example the power semiconductor device is a vertical power MOSFET 30 which consists of very many (hundreds of thousands) parallel-connected source cells sharing a common drain drift region provided by the epitaxial layer 22. The relatively highly doped substrate 21 provides a drain contact region which makes ohmic contact to the drain electrode 23. Each source cell comprises a p conductivity type body region 24 within which is formed on n conductivity type source region 25. In this case, the body and source regions 24 and 25 may be formed in a self-aligned manner by using the insulated gate structure 26 of the MOSFET as a mask so as to define the conduction channel region 27 of the MOSFET by the relative diffusions of the impurities introduced to form the body and source regions 24 and 25. The body region 24 may have a more highly doped central region 24a.

In this example, the power semiconductor device 30 is to form a low side switch and accordingly the source metallisation 28 (which also shorts the source to the body to avoid parasitic bipolar action) may be connected to ground while the drain electrode 23 will be connected to the load. The gate metallisation is not shown in FIG. 2.

In this case, the circuit 1 is formed within one or more p conductivity type isolation wells 31 provided within the epitaxial layer 22. The or each isolation well 31 may be provided adjacent the periphery of the power MOSFET 30 or may be provided actually in an area of the semiconductor body 20 surrounded by the power MOSFET source cells 24, 25. The latter arrangement would allow the first insulated gate field effect device 2 to be positioned at the centre of the power MOSFET 30 so that the maximum temperature of the power MOSFET 30 can be sensed. Preferably, for ease of manufacture, all of the circuit 1 components are formed in the one well 31, although it may of course be desirable to place the resistors R1 to R4 and possibly the IGFETs Q4 to Q7 away from the power MOSFET 20 in a separate well 31. The isolation well 31 is relatively lowly doped and may for example have a surface dopant concentration in the region of 11 to $13 \times 10^{12}$ atoms $cm^{-2}$ where the dopant is boron. The IGFETs Q1 to Q7 are all formed of a similar structure but, where required, have different conduction channel widths and lengths. Accordingly only one IGFET Q2 is shown in FIG. 2. As can be seen from FIG. 2, the IGFET Q2 has n conductivity type source and drain regions 34 and 33 formed in an autoaligned manner, using the insulated gate 34 as a mask, with a single implantation. The source, drain and gate metallisation S, D and G are provided in conventional manner. The back gate is connected as indicated above to the second power supply line 7 by means of an electrode 35 contacting the isolation well 31.

Each resistor R1 to R4 is formed, in the present example, within the or an isolation well 31. In this case each resistor comprises an n conductivity type well or region 36 formed within the isolation well 31. The n conductivity type region 36 may have a surface dopant concentration of typically 2.3 to $2.7 \times 10^{12}$ atoms $cm^{-2}$ where the dopant is arsenic. Electrodes 37 and 38 are formed spaced-apart on the n-conductivity type region 36 so that the n conductivity type region 36 provides a resistive path between the electrodes 37 and 38.

Such a resistor operates in a manner similar to a JFET (junction field effect transistor) insofar as the depletion region at the pn junction 36a between the region 36 and the isolation well 31 will vary in width along the resistor, being widest adjacent the positive potential electrode.

Such a structure has been found to provide a particularly useful behavior with temperature. Thus, the JFET like effects compensate for the normal diffused resistor type effects to provide the resistors R1 to R4 with an effective temperature coefficient which, referred to room temperature, actually increases with absolute temperature, so that the relative temperature coefficient referred to the measured temperature is virtually a constant. This compares to conventional diffused resistors for which the relative temperature coefficient decreases with temperature. In the case of the present circuit, therefore, the resistors R1 to R4 have a temperature coefficient of resistance which, unlike conventional diffused resistors, increases with temperature. Although this may lead to a reduction in the bias currents in IGFETs Q1 to Q3, it will at least partially be compensated for by the fall in the threshold voltage of IGFETs Q1 and Q2 and also to a lesser extent by the fall in the threshold voltage of IGFET Q3 with temperature.

As indicated above, the IGFET Q3 has to operate in its zero temperature coefficient range or area D. By selecting the values of the resistors R1 or R4 especially R3 and R4, appropriately, and in conjunction with the geometries of IGFETs Q1 to Q3, the effect of changes in the values of the resistors R1 to R4, especially R3 and R4 on the operating area of the IGFET Q3 can be minimised so that the IGFET Q3 operates substantially in its zero temperature coefficient range or area D over the temperature range which it is desired to sense, for example, 0° to 175° C.

In addition, any variations in the doping of the isolation well 31 will affect the JFET-like nature of the resistors R1 to R4 as well as the threshold voltages of the IGFETs so that the circuit 1 should be less sensitive to variations in the manufacturing process.

In the operation of the circuit shown in FIG. 1, as indicated above, resistors R3 and R4 serve to bias the IGFET Q3 into an area of its operating range where its gate-source voltage is substantially independent of temperature while resistors R1 and R2 bias the IGFETs Q1 and Q2 deeply into their subthreshold region where their gate-source voltage has a high temperature coefficient, typically about 2 to 3 millivolts per degree Kelvin.

The circuit 1 is designed such that when the first and second insulated gate field effect devices 2 and 3 are at a temperature lying within the normal temperature range, that is the acceptable temperature range of the power semiconductor device where the circuit 1 is designed to protect such a device from excessive temperatures, the gate to source voltage of the first insulated gate field effect device 2 is higher than that of the second insulated gate field effect device 1 so that the comparator 4 provides an output signal OT indicating that the temperature range is acceptable. As the absolute temperature increases, the gate-to-source voltages of the IGFETs Q1 and Q2 which are biased into their subthreshold region will fall until, at a given selected temperature, say 150° or 175° C., determined by the values of the resistors R1 to R4, the voltage at the node 8 falls below that at the node 9 causing the output OT of the comparator 4 to change to indicate that the given selected temperature has been exceeded. This output OT may be used to, for example, switch off the power MOSFET 30 shown in FIG. 2.

FIG. 5 illustrates the circuit diagram for a modified version of the temperature sensing circuit shown in FIG. 1. The modified temperature sensing circuit 1' shown in FIG. 5 differs from that shown in FIG. 1 by the presence of a further resistor R5 between the junction or node 8 and the IGFET Q2. In other respects the circuit shown in FIG. 5 is similar to that shown in FIG. 1.

The incorporation of the further resistor R5 serves to make the circuits less sensitive to the supply voltage $V_s$ so that the given selected temperature at which the output OT of the comparator 4 changes to indicate an over-temperature is less sensitive to changes in the supply voltage $V_s$. Thus, in the circuit 1 shown in FIG. 1, if the supply voltage $V_s$ increases the voltage at node or junction 9 will increase because of the increased bias currents through resistors R3 and R4 and IGFET Q3. As the IGFET Q3 is operating in an area of its square law region where the voltage across it is substantially independent of temperature, IGFET Q3 has a poor ratiometric gain, that is a small change $\Delta I_D/I_D$ in the drain current requires a significant change $\Delta V_{gs}$ in the gate-source voltage, and so that the voltage at junction 9 will increase significantly an increase in the supply voltage. In comparison, because IGFETs Q1 and Q2 are operating in their subthreshold region and have a high ratiometric gain of, for example, 6 to 8 decades of current per volt, although the bias current through the IGFETs Q1 and Q2 increases with an increase in the supply voltage, the voltage at the drain of IGFET Q2 will barely increase. However, in the circuit shown in FIG. 5, the incorporation of the resistor R5 allows the voltage at the node or junction 8 to increase with the supply voltage and by selecting the values of the resistors R1,R2 and R5 appropriately to provide a suitable resistive divider R5/(R1+R2+R5), the effect of the change in the supply voltage $V_s$ on the voltage at node 9 due to the output characteristic, in particular the low sensitivity of the drain current to a change in the gate-source voltage $V_{gs}$, of IGFET Q3 can be compensated for, so making the circuit less sensitive to changes in supply voltage $V_x$.

The extra voltage across the resistor R5 means that the IGFETs Q1 and Q2 need to operate deeper into their subthreshold regions to achieve the same given selected temperature as in the circuit 1 shown in FIG. 1, but this can be achieved by appropriate selection of the relative values of the various resistors. The actual values of the various resistors will of course depend upon the particular circuit components, including the characteristics of the IGFETs Q1 to Q3, and the actual operating requirements but, to give an example of the relative magnitudes, resistors R1 and R2 may have a total resistance in the region of 220 Kilo Ohms while resistors R3 and R4 may have a total resistance in the region of 120 Kilo Ohms and resistor R5 may have a resistance in the region of 20 Kilo Ohms to 50 Kilo Ohms. All of the resistors R1 to R5 may be formed in the manner described above.

The circuit shown in FIG. 1 or FIG. 5 has particular advantages where it is integrated with a power semiconductor device 30 which acts as a low-side switch. Thus, for example, the circuit 1 or 1' does not require the use of bipolar transistors or complementary MOSFETs which would, in such circumstances, require the use of relatively complex processing technology and a large number of mask steps. In addition, it is not dependent on the dc substrate voltage which in the case of a low-side switch will be determined by the load, nor is it sensitive to rapid changes in the substrate voltage which may be particularly important in a low-side switch having a load such as a lamp where the initial onset conditions may be considerably different from the steady state on conditions.

It will of course be appreciated that the conductivity types given above could be reversed. In addition, where mention is made of a power semiconductor device it should be appreciated that power semiconductor devices other than MOSFETs, for example, IGBTs (Insulated Gate Bipolar Transistors) could be used. Also, although the various IGFETs Q1 to Q7 are shown diode-connected so that the drain to source voltage is equal to the gate to source voltage, it may be possible for there to be a predetermined fixed voltage difference between the drains and gates of the IGFETs rather than a direct diode connection.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention.

We claim:

1. A temperature sensing circuit comprising: a first insulated gate field effect device, a second insulated gate field effect device, means for operating the first insulated gate field effect device in its subthreshold region so that the voltage across the first insulated gate field effect device varies with temperature, means for comparing the voltages across the first and second insulated gate field effect devices, and means for operating the second insulated gate field effect device in an area of its square law region where the voltage across the second insulated gate field effect device is substantially independent of temperature so that the comparing means provides a signal indicative of the temperature sensed by the first insulated gate field effect device.

2. A circuit according to claim 1, further comprising a resistor connected in series with the first insulated gate field effect device, and wherein the comparing means is arranged to compare the voltage across the series connection of the first insulated gate field device and the resistor with the voltage across the second insulated gate field effect device.

3. A circuit according to claim 2, wherein the first and second insulated gate field effect devices comprise diode-connected insulated gate field effect transistors.

4. A circuit according to claim 2, wherein the first insulated gate field effect device comprises two insulated gate field effect transistors each having one main electrode connected to its gate electrode, the other main electrode of one of the two transistors being connected to the one main electrode of the other transistor, each of the two transistors having a back gate electrode with the back gate electrode of the other transistor connected to the same potential as the back gate electrode of the one transistor.

5. A circuit according to claim 2, wherein the means for operating the first and second insulated gate field effect devices comprises respective resistors connected in series with the first and second insulated gate field effect devices.

6. A circuit according to claim 2 further comprising, means for clamping voltages across the first and second insulated gate field effect devices at a given voltage level.

7. A circuit according to claim 1, wherein the first and second insulated gate field effect devices comprise diode-connected insulated gate field effect transistors.

8. A circuit according to claim 7, wherein the first insulated gate field effect device comprises at least two series-connected insulated gate field effect transistors while the second insulated gate field effect device comprises a single insulated gate field effect transistor.

9. A circuit according to claim 1 wherein the first insulated gate field effect device comprises two insulated gate field effect transmission each having one main electrode connected to its gate electrode, the other main electrode of one of the two transistors being connected to the one main electrode of the other transistor, each of the two transistors having a back gate electrode with the back gate electrode of the other transistor connected to the same potential as the back gate electrode of the one transistor.

10. A circuit according to claim 9, wherein the means for operating the first and second insulated gate field effect devices comprises respective resistors connected in series with the first and second insulated gate field effect devices.

11. A circuit according to claim 1, wherein the means for operating the first and second insulated gate field effect devices comprises respective resistors connected in series with the first and second insulated gate field effect devices.

12. A circuit according to claim 11, further wherein each resistor comprises a diffused resistor formed in a surface region of one conductivity type of a semiconductor body, each resistor comprising a first region of the opposite conductivity type formed within the surface region and a second region of the one conductivity type formed within the first region, first and second electrodes being provided spaced-apart in contact with the second region which provides a resistive path between the first and second electrodes, and a third electrodes being provided for connecting the second region to a fixed reference potential.

13. A circuit according to claim 12 wherein the means for operating the first and second insulated gate field effect devices comprise first and second insulated gate field effect devices with conduction channels of different widths.

14. A circuit according to claim 12, further comprising voltage clamping means for regulating the voltage across the first and second insulated gate field effect devices.

15. A circuit according to claim 11, further comprising voltage clamping means for regulating the voltage across the first and second insulated gate field effect devices.

16. A circuit according to claim 1, further comprising voltage clamping means for regulating the voltage across the first and second insulated gate field effect devices.

17. A circuit according to claim 16, wherein the voltage clamping means comprises a series arrangement of diode-connected insulated gate field effect transistors.

18. A circuit according to claim 1, wherein the circuit is integrated with a power semiconductor device such that the circuit provides a signal for switching off the power semiconductor device when the temperature of the power semiconductor device sensed by the first insulated gate field effect device exceeds a predetermined value.

19. A circuit according to claim 1, wherein the first insulated gate field effect device comprises at least two-series connected insulated gate field effect transistors while the second insulated gate field effect device comprises a single insulated gate field effect transistor.

20. A circuit according to claim 19, wherein the means for operating the first and second insulated gate field effect devices comprises respective resistors connected in series with the first and second insulated gate field effect devices.

21. A circuit according to claim 20, wherein each resistor comprises a diffused resistor formed in a surface region of one conductivity type of a semiconductor body, each resistor comprising a first region of the opposite conductivity type formed within the surface region and a second region of the one conductivity type formed within the first region, first and second electrodes being provided spaced-apart in contact with the second region which provides a resistive path between the first and second electrodes, and a third electrode being provided for connecting the second region to a fixed reference potential.

22. A circuit according to claim 1 wherein the means for operating the first and second insulated gate field effect devices comprise first and second insulated gate field effect transistors, respectively, having conduction channels of different widths.

23. A circuit according to claim 1 further comprising, first and second resistors coupled in series with said first and second insulated gate field effect devices, respectively, to terminals or a supply voltage for the circuit, and a series arrangement of diode-connected insulated gate field effect transistors coupled to respective junction points between the first resistor and the first insulated gate field effect device and the second resistor and the second insulated gate field effect device so as to clamp the voltages across the first and second insulated gate field effect devices at a given voltage level.

24. A temperature sensing circuit comprising:
a first field effect transistor device arranged to respond to a temperature to be sensed,
a second field effect transistor device,
means for operating the first field effect transistor device in its subthreshold region where the voltage across the device varies with temperature and for operating the second field effect transistor device in an area of its square law region where the voltage across the second field effect transistor device substantially independent of temperature, and
means for comparing the voltages across the first and second field effect transistor devices thereby to derive at an output of the comparing means a signal indicative of the temperature to be sensed.

25. A temperature sensing circuit as claimed in claim 24, further comprising:
a first resistor connected in a first series circuit with the first field effect transistor device across a pair of supply voltage terminals for the circuit,
a second resistor connected in a second series circuit with the second field effect transistor device across said pair of supply voltage terminals, and wherein,
the first field effect transistor device comprises at least first and second diode-connected field effect transistors connected in series, and
the second field effect transistor device comprises a third diode-connected field effect transistor.

* * * * *